(12) United States Patent
Nakatsuka et al.

(10) Patent No.: US 11,025,241 B2
(45) Date of Patent: Jun. 1, 2021

(54) COMPARATOR CIRCUIT AND MOBILE DEVICE

(71) Applicant: SAMSUNG ELECTRONICS CO., LTD., Suwon-si (KR)

(72) Inventors: Shinji Nakatsuka, Suwon-si (KR); Koji Mishina, Suwon-si (KR); Noriyuki Fukushima, Suwon-si (KR)

(*) Notice: Subject to any disclaimer, the term of this patent is extended or adjusted under 35 U.S.C. 154(b) by 0 days.

(21) Appl. No.: 16/704,898

(22) Filed: Dec. 5, 2019

(65) Prior Publication Data
US 2020/0204170 A1 Jun. 25, 2020

(30) Foreign Application Priority Data

Dec. 20, 2018 (JP) .............................. JP2018-237883
Jul. 22, 2019 (KR) ..................... 10-2019-0088302

(51) Int. Cl.
*H03K 5/24* (2006.01)
*H03M 1/12* (2006.01)

(52) U.S. Cl.
CPC .......... *H03K 5/2481* (2013.01); *H03K 5/249* (2013.01); *H03M 1/129* (2013.01)

(58) Field of Classification Search
None
See application file for complete search history.

(56) References Cited

U.S. PATENT DOCUMENTS

| | | | |
|---|---|---|---|
| 7,321,329 B2 * | 1/2008 | Tooyama | H03M 1/0607 341/163 |
| 8,742,313 B2 | 6/2014 | Takamiya et al. | |
| 9,654,086 B1 * | 5/2017 | Fifield | H03K 3/011 |
| 9,918,032 B2 * | 3/2018 | Hagihara | H04N 5/3765 |
| 2009/0128676 A1 * | 5/2009 | Tanaka | H04N 5/2253 348/300 |
| 2013/0300907 A1 * | 11/2013 | Tanaka | H04N 5/374 348/308 |
| 2015/0187335 A1 * | 7/2015 | Sugiyama | G09G 3/2014 345/208 |
| 2016/0118970 A1 * | 4/2016 | Kim | H03F 3/45968 330/254 |

(Continued)

FOREIGN PATENT DOCUMENTS

| | | |
|---|---|---|
| JP | 2011166278 | 3/2011 |
| JP | 2012109658 | 6/2012 |

*Primary Examiner* — Lincoln D Donovan
*Assistant Examiner* — Khareem E Almo
(74) *Attorney, Agent, or Firm* — F. Chau & Associates, LLC

(57) ABSTRACT

A comparator circuit includes a differential input circuit, a load circuit, a first current source, a first bias voltage supplying circuit, a third connection circuit, and a fourth connection circuit. The differential input circuit includes a first transistor to which a first input signal is supplied and a second transistor to which a second input signal is supplied. The load circuit includes a third transistor connected to the first transistor through a first connection circuit and a fourth transistor connected to the second transistor through a second connection circuit, gates of the third and fourth transistors being connected to the first connection circuit through a third capacitor. The first bias voltage supplying circuit supplies a first bias voltage to the gates of the third and fourth transistors and the third capacitor.

19 Claims, 6 Drawing Sheets

(56) References Cited

U.S. PATENT DOCUMENTS

| | | | |
|---|---|---|---|
| 2018/0013412 A1* | 1/2018 | Kikuchi | H04N 5/3765 |
| 2018/0160066 A1* | 6/2018 | Matsuzawa | H03M 1/38 |
| 2018/0324379 A1* | 11/2018 | Ebihara | H04N 5/378 |
| 2019/0044478 A1* | 2/2019 | Kobayashi | H03B 1/02 |
| 2020/0076413 A1* | 3/2020 | Lee | H03K 5/2472 |
| 2020/0145599 A1* | 5/2020 | Matsuzaki | H04N 5/378 |

* cited by examiner

COMPARATOR CIRCUIT AND MOBILE DEVICE

CROSS-REFERENCE TO RELATED APPLICATIONS

This U.S. non-provisional patent application claims priority under 35 U.S.C. § 119 to Japan Patent Application No. 2018-237883 filed on Dec. 20, 2018, in the Japan Patent Office and to Korean Patent Application No. 10-2019-0088302 filed on Jul. 22, 2019 in the Korean Intellectual Patent Office, the disclosures of which are incorporated by reference herein in their entireties.

BACKGROUND

1. Technical Field

Embodiments of the inventive concept described herein relate to a comparator circuit, an analog-to-digital converter (ADC) circuit, a semiconductor device, and a mobile device.

2. Discussion of Related Art

Nowadays, there is an intensive demand for low power consumption image sensors manufactured using large scale integration (LSI) techniques for being used in mobile devices such as smartphones. An analog-to-digital converter (ADC) that is embedded in the LSI image sensor is a main user of power in the image sensor LSI. For this reason, the implementation of a low-power ADC may result in a low power consumption LSI image sensor.

To this end, various techniques associated with the ADC have been proposed. For example, a differential amplifier circuit that suppresses a change of an output operating point due to a change of a common-mode input voltage has been proposed in Japanese patent document (JP2011-166278A). A related differential amplifier circuit includes two pairs of complementary metal-oxide semiconductor (CMOS) inverting amplifiers.

SUMMARY

At least one embodiment of the inventive concept provides a comparator circuit that is able to be driven with a low power supply voltage.

A comparator circuit according to an exemplary embodiment of the inventive concept includes a differential amplifier that compares a first input signal and a second input signal to output a comparison result, and an output amplifier configured to output an amplified signal based on the comparison result. The differential amplifier includes a differential input circuit, a load circuit, a first current source, a first bias voltage supplying circuit, a third connection circuit, and a fourth connection circuit. The differential input circuit includes a first transistor and a second transistor. The first input signal is applied to a gate of the first transistor through a first capacitor, and the second input signal is supplied to a gate of the second transistor through a second capacitor. The load circuit is provided at the differential input circuit. The load circuit includes a third transistor connected to the first transistor with a first connection circuit interposed therebetween and a fourth transistor connected to the second transistor with a second connection circuit interposed therebetween. Gates of the third transistor and the fourth transistor are connected to the first connection circuit through a third capacitor. The first current source is a current source of the differential input circuit and is connected to the first transistor and the second transistor. The first bias voltage supplying circuit supplies a first bias voltage to the gates of the third transistor and the fourth transistor and the third capacitor. The third connection circuit connects the gate of the first transistor and the first connection circuit. The fourth connection circuit connects the gate of the second transistor and the second connection circuit. The output amplifier includes a fifth transistor, a second current source, and a sixth connection circuit. A signal based on the comparison result is supplied to a gate of the fifth transistor through a fourth capacitor. The second current source is connected to the fifth transistor with a fifth connection circuit interposed therebetween A sixth connection circuit connects the gate of the fifth transistor and the fifth connection circuit. A node of the fifth connection circuit outputs the amplified signal.

In an exemplary embodiment of the comparator circuit, the first bias voltage supplying circuit includes a first switch adjusting a timing to supply the first bias voltage, and the third connection circuit includes a second switch adjusting a timing to connect the gate of the first transistor and the first connection circuit.

In an exemplary embodiment, the fourth connection circuit includes a third switch adjusting a timing to connect the gate of the second transistor and the second connection circuit, and the sixth connection circuit includes a fourth switch adjusting a timing to connect the gate of the fifth transistor and the fifth connection circuit. By this configuration, the comparator circuit may set an operating point of each transistor.

In an exemplary embodiment of the comparator circuit, the differential amplifier further includes a second bias voltage supplying circuit supplying a second bias voltage to the first connection circuit, and a fifth switch adjusting a timing to supply the second bias voltage to the first connection circuit. By this configuration, the comparator circuit may supply a bias voltage more appropriate for the load circuit.

In an exemplary embodiment of the comparator circuit, the first switch is turned on before the second switch, the third switch, the fourth switch, and the fifth switch are turned on, wherein the fifth switch is turned on simultaneously with the second switch, the third switch, and the fourth switch, and the second switch, the third switch, and the fourth switch are turned off after the first switch and the fifth switch are turned off. By this configuration, it may be possible to set an operating point more appropriately with respect to each transistor.

In an exemplary embodiment of the comparator circuit, the differential amplifier further includes a buffer circuit between the first capacitor and the gate of the first transistor. Further in the exemplary embodiment, the buffer circuit includes a constant current supplying circuit, a buffer transistor, a second bias voltage supplying circuit, and a sixth switch. Further in the exemplary embodiment, the constant current supplies circuit supplying a given current. Further in the exemplary embodiment, one of a source and a drain of the buffer transistor is connected to the constant current supplying circuit, the other thereof is connected to a ground, and the first input signal and a second bias voltage are supplied to a gate of the buffer transistor. Further in the exemplary embodiment, the second bias voltage supplying circuit supplies the second bias voltage. Further in the exemplary embodiment, the sixth switch adjusts a timing to supply the second bias voltage to the gate of the buffer transistor. By this configuration, the load of the second bias voltage supplying circuit may decrease.

In an exemplary embodiment of the comparator circuit, the second switch, the third switch, and the fourth switch may be turned on after the first switch and the sixth switch are turned on and may be turned off after the first switch and the sixth switch are turned off. By this configuration, a comparator circuit including a buffer circuit may set an operating point more appropriately with respect to each transistor.

In an exemplary embodiment of the comparator circuit, each of the first current source and the second current source includes a current source transistor, a gate of which is supplied with a third bias voltage. In this case, each of the first current source and the second current source may further include a current source switch adjusting a timing to supply the third bias voltage. In addition, the current source switch may be turned off simultaneously when the first switch is turned off. By this configuration, it may be possible to reduce an influence that a comparator circuit has over a peripheral configuration.

An ADC circuit according to at least one embodiment of the inventive concept includes a plurality of the comparator circuits.

A semiconductor circuit according to at least one exemplary embodiment of the inventive concept includes the ADC circuit, and a plurality of photoelectric conversion elements arranged in a matrix shape. The ADC circuit may perform discrete processing on an analog signal generated by the photoelectric conversion elements. In addition, a mobile device according an exemplary embodiment of the inventive concept may include the semiconductor device, and a lens for imaging a picture of a subject. The semiconductor device may generate and processes picture data imaged through the lens. By this configuration, the ADC circuit, the semiconductor device, and the mobile device may reduce power consumption.

According to an exemplary embodiment of the inventive concept, a comparator circuit includes a differential amplifier and an output amplifier. The differential amplifier is configured to compare a first input signal and a second input signal to output a comparison result. The output amplifier is configured to output an amplified signal based on the comparison result. The differential amplifier includes a differential input circuit, a load circuit, a first current source, a first bias voltage supplying circuit, a third connection circuit, a fourth connection circuit, and a buffer circuit. The differential input circuit includes a first transistor and a second transistor, the first input signal being applied to a gate of the first transistor through a first capacitor and the second input signal being supplied to a gate of the second transistor through a second capacitor. The load circuit provides a load to the differential input circuit and includes a third transistor connected to the first transistor with a first connection circuit interposed therebetween and a fourth transistor connected to the second transistor with a second connection circuit interposed therebetween, where gates of the third transistor and the fourth transistor are connected to the first connection circuit through a third capacitor. The first current source is a current source of the differential input circuit and is connected to the first transistor and the second transistor. The first bias voltage supplying circuit supplies a first bias voltage. The third connection circuit connects the gate of the first transistor and the first connection circuit. The fourth connection circuit connects the gate of the second transistor and the second connection circuit. The buffer circuit is connected between the first capacitor and the gate of the first transistor.

BRIEF DESCRIPTION OF THE FIGURES

The inventive concept will become apparent by describing in detail exemplary embodiments thereof with reference to the accompanying drawings.

DETAILED DESCRIPTION OF THE EXEMPLARY EMBODIMENTS

Figure 1:
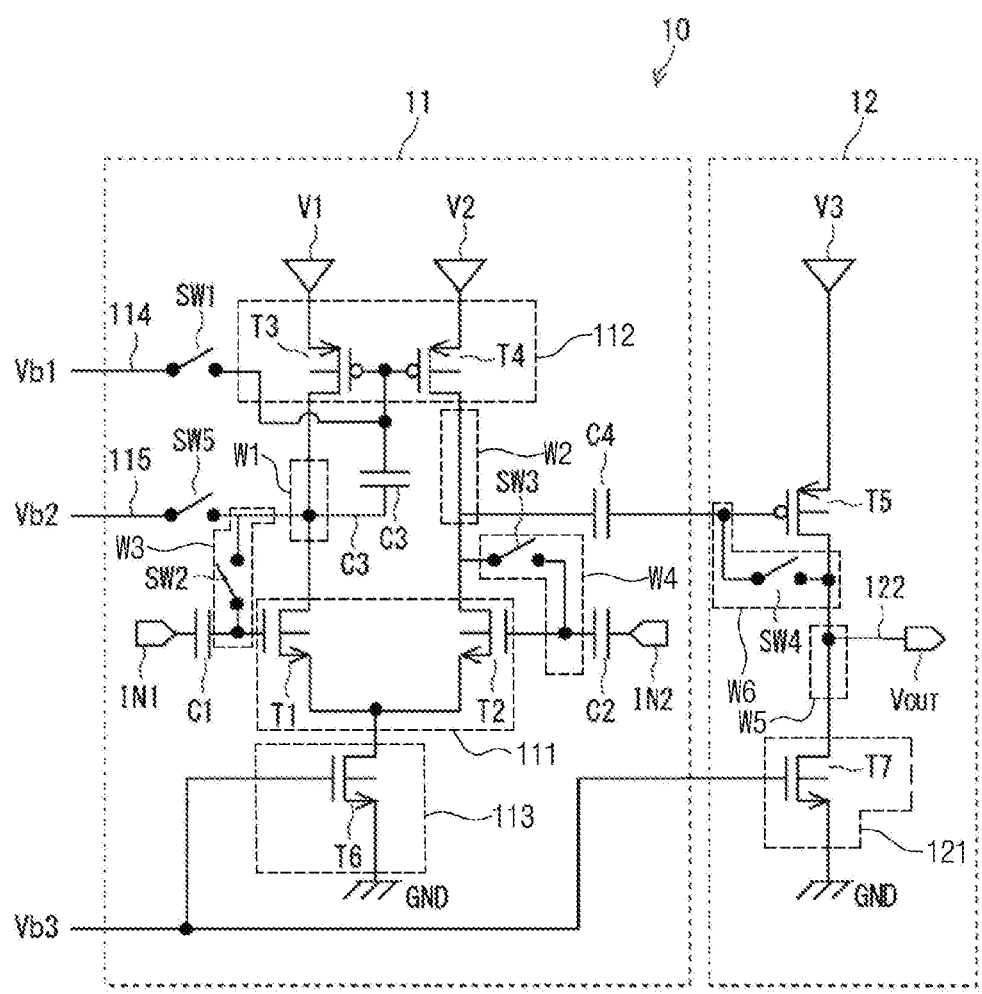
FIG. 1 is a circuit diagram of a comparator circuit according to an exemplary embodiment of the inventive concept.

Hereinafter, exemplary embodiments of the inventive concept in conjunction with accompanying drawings will be described. Below, details, such as detailed configurations and structures are provided to aid a reader in understanding embodiments of the inventive concept. Therefore, embodiments described herein may be variously changed or modified without departing from embodiments of the inventive concept. The same reference numeral indicates the same part throughout the accompany drawings.

FIG. 1 is a circuit diagram of a comparator circuit according to an exemplary embodiment of the inventive concept. A comparator circuit 10 illustrated in FIG. 1 may be used within an analog to digital converter (ADC), for example.

The comparator circuit 10 includes a differential amplifier 11 that compares a first input signal IN1 and a second input signal IN2 provided in the form of a differential signal and outputs a result of the comparison (i.e., a comparison result) and an output amplifier 12 that outputs an output signal VOUT in response to the comparison result. The output signal VOUT is referred to as an "amplified signal".

Below, the differential amplifier 11 will be described. The differential amplifier 11 includes a differential input circuit 111, a load circuit 112, a first current source 113, a first bias voltage supplying circuit 114, a second bias voltage supplying circuit 115, a third connection circuit W3, and a fourth connection circuit W4.

The differential input circuit 111 includes a first transistor T1, the gate of which is supplied with the first input signal IN1 through a first capacitor C1, and a second transistor T2, the gate of which is supplied with the second input signal IN2 through a second capacitor C2. In an exemplary embodiment, the first transistor T1 and the second transistor T2 are an N-type metal-oxide-semiconductor field-effect transistor (MOSFET). The N-type MOSFET is referred to as an "NMOS transistor".

The load circuit 112 corresponds to the differential input circuit 111 and forms a load differential transistor stage. The load circuit 112 includes a third transistor T3 and a fourth transistor T4. In an exemplary embodiment, the third transistor T3 and the fourth transistor T4 are a P-type MOSFET. The P-type MOSFET is referred to as a "PMOS transistor".

A source of the third transistor T3 is connected to a first power source V1, and a drain thereof is connected to a drain of the first transistor T1 through a first connection circuit W1 interposed therebetween. A source of the fourth transistor T4 is connected to a second power source V2, and a drain thereof is connected to a drain of the second transistor T2 through a second connection circuit W2 interposed therebetween. Gates of the third transistor T3 and the fourth transistor T4 are connected to each other. Also, the gates of the third transistor T3 and the fourth transistor T4 are connected to the first connection circuit W1 through a third capacitor C3 interposed therebetween. The third transistor T3 and the fourth transistor T4 of the load circuit 112 constitute a current mirror circuit that is diode-connected to a side of the first transistor T1. However, the third capacitor C3 is added to the diode-connected configuration.

Also, the load circuit 112 is connected to the first bias voltage supplying circuit 114. The first bias voltage supplying circuit 114 supplies a first bias voltage Vb1 to a node between the gates of the third transistor T3 and the fourth transistor T4 and the third capacitor C3. The first bias voltage supplying circuit 114 includes the first switch SW1 that adjusts a timing to supply the first bias voltage Vb1. By the adjustment of the first switch SW1, the load circuit 112 receives the first bias voltage Vb1, and an operating point is set according to the received bias voltage. For example, the first switch SW1 may be controlled (turned on and off) by a first control signal (not shown). For example, the first switch SW1 may be implemented by a transistor having a gate receiving the first control signal.

The first current source 113 is a current source of the differential input circuit 111 and is connected to the first transistor T1 and the second transistor T2. The first current source 113 includes a sixth transistor T6. In an exemplary embodiment, the sixth transistor T6 is an NMOS transistor. A drain of the sixth transistor T6 is connected to sources of the first transistor T1 and the second transistor T2, and a source thereof is connected to a ground GND. A third bias voltage Vb3 is supplied to a gate of the sixth transistor T6.

The third connection circuit W3 connects a gate of the first transistor T1 and the first connection circuit W1. That is, the gate and the drain of the first transistor T1 are short-circuited through the third connection circuit W3.

The third connection circuit W3 includes a second switch SW2. The second switch SW2 adjusts a timing to connect the gate of the first transistor T1 and the first connection circuit W1. An operating point of the first transistor T1 is set by the adjustment of the second switch SW2. For example, the second switch SW2 may be controlled (turned on and off) by a second control signal (not shown). For example, the second switch SW2 may be implemented by a transistor having a gate receiving the second control signal.

The fourth connection circuit W4 connects a gate of the second transistor T2 and the second connection circuit W2. That is, the gate and the drain of the second transistor T2 are short-circuited through the fourth connection circuit W4.

The fourth connection circuit W4 includes a third switch SW3. The third switch SW3 adjusts a timing to connect the gate of the second transistor T2 and the second connection circuit W2. An operating point of the second transistor T2 is set by the adjustment of the third switch SW3. For example, the third switch SW3 may be controlled (turned on and off) by a third control signal (not shown). For example, the third switch SW3 may be implemented by a transistor having a gate receiving the third control signal.

The second bias voltage supplying circuit 115 is connected to the first connection circuit W1 and supplies a second bias voltage Vb2 to the first connection circuit W1. The second bias voltage supplying circuit 115 includes a fifth switch SW5. The fifth switch SW5 adjusts a timing to supply the second bias voltage Vb2 to the first connection circuit W1. A drain-source voltage Vds of the third transistor T3 is set by the adjustment of the fifth switch SW5. For example, the fifth switch SW5 may be controlled (turned on and off) by a fifth control signal (not shown). For example, the fifth switch SW5 may be implemented by a transistor having a gate receiving the fifth control signal.

According to the above configuration, the differential amplifier 11 is supplied with the first input signal IN1 and the second input signal IN2, generates a signal indicating a result of comparing the two signals IN1 and IN2, and supplies the generated signal to the output amplifier 12.

Below, the output amplifier 12 will be described. The output amplifier 12 receives a signal supplied from the differential amplifier 11 and outputs the output signal VOUT in response to the received signal. A main configuration of the output amplifier 12 includes a fifth transistor T5, a second current source 121, a sixth connection circuit W6, and an output part 122.

In an exemplary embodiment, the fifth transistor T5 is a PMOS transistor. A source of the fifth transistor T5 is connected to a power source V3. The signal of the comparison result that the differential amplifier 11 outputs is supplied to a gate of the fifth transistor T5 through a fourth capacitor C4. A drain of the fifth transistor T5 is connected to the second current source 121 through a fifth connection circuit W5. As an output of the differential amplifier 11 is supplied to the fifth transistor T5 through the fourth capacitor C4, voltage separation is made between the differential amplifier 11 and the output amplifier 12, thereby preventing the differential amplifier 11 from having an influence on the output amplifier 12.

The second current source 121 is connected to the fifth transistor T5 through the fifth connection circuit W5 interposed therebetween.

The second current source 121 includes a seventh transistor T7. In an exemplary embodiment, the seventh transistor T7 is an NMOS transistor. A drain of the seventh transistor T7 is connected to a drain of the fifth transistor T5 through the fifth connection circuit W5 interposed therebetween. A source of the seventh transistor T7 is connected to the ground GND. The third bias voltage Vb3 is supplied to a gate of the seventh transistor T7. In addition, as illustrated in FIG. 1, the third bias voltage Vb3 supplied to the gate of the seventh transistor T7 and to the gate of the sixth transistor T6. The gate of the seventh transistor T7 and the gate of the sixth transistor T6 may receive the third bias voltage Vb3 from the same power source.

The sixth connection circuit W6 connects the gate of the fifth transistor T5 and the fifth connection circuit W5. That is, the gate and the drain of the fifth transistor T5 are short-circuited through the sixth connection circuit W6.

The sixth connection circuit W6 includes a fourth switch SW4. The fourth switch SW4 adjusts a timing to connect the gate of the fifth transistor T5 and the fifth connection circuit W5. An operating point of the fifth transistor T5 is set by the adjustment of the fourth switch SW4. For example, the fourth switch SW4 may be controlled (turned on and off) by a fourth control signal (not shown). For example, the fourth switch SW4 may be implemented by a transistor having a gate receiving the fourth control signal.

The output part 122 is disposed in the fifth connection circuit W5 and outputs the output signal VOUT that the output amplifier 12 generates.

Figure 2:
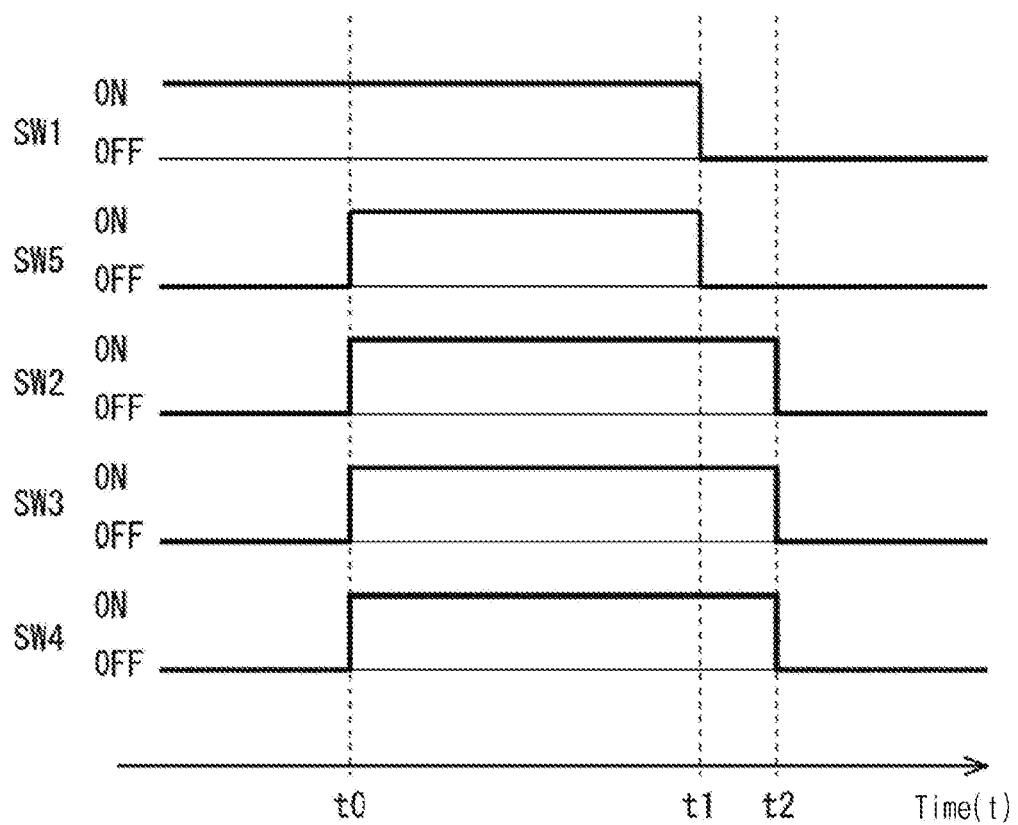
FIG. 2 is a timing diagram of switches in the comparator circuit of FIG. 1 according to an exemplary embodiment of the inventive concept.

Below, an operating timing of switches of the comparator circuit 10 according to an exemplary embodiment of the inventive concept will be described with reference to FIG. 2. FIG. 2 is a timing diagram of switches in the comparator circuit 10 shown in FIG. 1. In FIG. 2, a horizontal axis represents a time "t", and a vertical axis represents a switch state (on or off). For example, the first switch SW1 is turned on before a time t0 and changes from an on state to an off state at a time t1. The fifth switch SW5 changes from the off state to the on state at the time t0 and changes from the on state to the off state at the time t1. The second switch SW2, the third switch SW3, and the fourth switch SW4 change from the off state to the on state at the time t0 and change from the on state to the off state at a time t2.

As illustrated in FIG. 2, in the comparator circuit 10, the first switch SW1 is turned on before the second switch SW2, the third switch SW3, the fourth switch SW4, and the fifth switch SW5 are turned on. Also, the fifth switch SW5 is turned on at the same time with the second switch SW2, the third switch SW3, and the fourth switch SW4, and the fifth switch SW5 is turned off at the same time with the first switch SW1. The second switch SW2, the third switch SW3, and the fourth switch SW4 are turned off after the first switch SW1 and the fifth switch SW5 are turned off. The comparator circuit 10 sets an operating point of each transistor by adjusting each switch depending on the above timing.

The comparator circuit 10 of FIG. 1 according to an exemplary embodiment of the inventive concept is described above. As described above, the comparator circuit 10 according to an exemplary embodiment of the inventive concept is configured to set operating points of transistors independently of each other. Also, since a capacitor is provided at a gate of each transistor in the comparator circuit 10 as described above, each direct current (DC) component is separated, while an alternating current component propagates. As such, for example, the first bias voltage Vb1 supplied to the gate of the third transistor T3 and the second bias voltage Vb2 supplied to the drain of the third transistor T3 are set to different values. Accordingly, the first bias voltage Vb1 is set in such a way that a gate-source voltage Vgs is greater than a threshold voltage Vth of the third transistor T3. The second bias voltage Vb2 may be different from the first bias voltage Vb1, and the drain-source voltage Vds that allows the third transistor T3 to normally operate in a saturation region may be set based on the second bias voltage Vb2.

In an exemplary embodiment, the comparator circuit 10 sets the second bias voltage Vb2 to be higher than the first bias voltage Vb1. Accordingly, a transistor of the comparator circuit 10 may set the drain-source voltage Vds to a value appropriate for a constant voltage driving manner. As such, the comparator circuit 10 may reduce a driving voltage.

The comparator circuit 10 may be used in a device requiring low power consumption. For example, the comparator circuit 10 may be used in a mobile device having a camera function. The mobile device includes an image sensor that generates picture data obtained by imaging a subject by using a lens. In the image sensor, a plurality of photoelectric conversion elements (e.g., imaging elements) may be arranged in the form of a matrix generate analog signals, and a single slope ADC performs discrete processing on the analog signals. Accordingly, the mobile device including the comparator circuit 10 may reduce power consumption.

According to an exemplary embodiment, the comparator circuit 10 is able to be driven with a low voltage. Power consumption of an ADC circuit, a semiconductor device, or a mobile device that includes the comparator circuit 10 according to an exemplary embodiment may be reduced.

A comparator circuit according to an exemplary embodiment of the inventive different from the comparator circuit 10 of FIG. 1 is described below. For example, different from the comparator circuit 10 of FIG. 1, the comparator circuit of FIG. 3 includes a buffer circuit for making a load current of a second bias voltage small.

Figure 3:
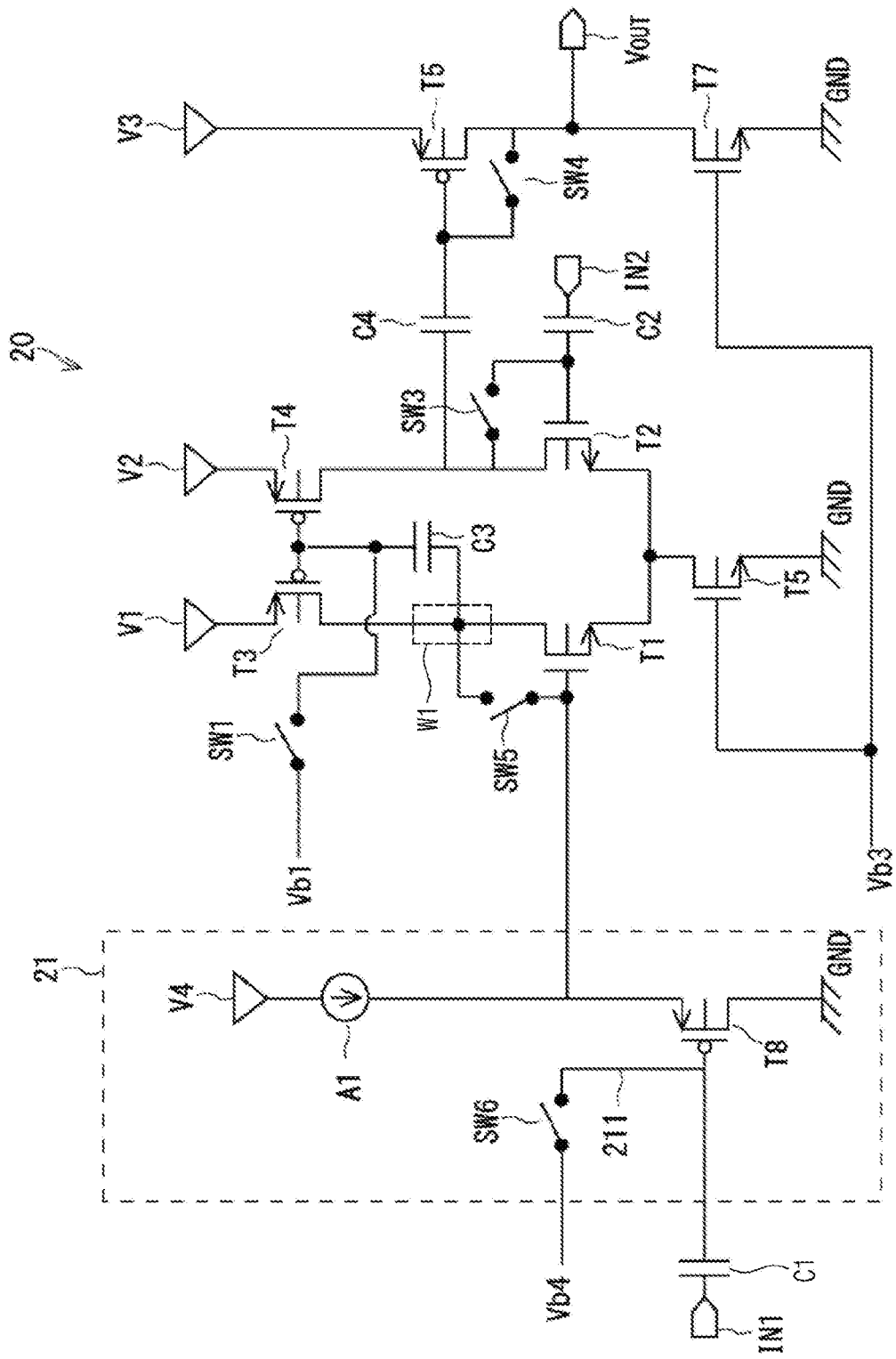
FIG. 3 is a circuit diagram of a comparator circuit according to an exemplary embodiment.

FIG. 3 is a circuit diagram of a comparator circuit according to an exemplary embodiment of the inventive concept. With regard to the components/elements described above, additional description will be omitted to avoid redundancy.

A comparator circuit 20 illustrated in FIG. 3 includes a buffer circuit 21 connected to a node receiving the first input signal IN1 and an input stage of a second bias voltage. In other words, the differential amplifier 11 further includes a buffer circuit between the first capacitor C1 and the gate of the first transistor T1. The buffer circuit 21 includes a constant current supplying circuit A1 and a buffer transistor T8.

The constant current supplying circuit A1 is a constant current source capable of supplying a given current and is connected to a power source V4 and a source of the buffer transistor T8. Also, the constant current supplying circuit A1 is connected to the gate of the first transistor T1 and supplies a given signal to the first transistor T1 depending on a switching operation of the buffer transistor T8.

In an embodiment, the buffer transistor T8 is a PMOS transistor. The buffer transistor T8 includes a source connected to the constant current supplying circuit A1 and a drain connected to the ground GND. A gate of the buffer transistor T8 is connected to the first capacitor C1 and a second bias voltage supplying circuit 211. The second bias voltage supplying circuit 211 supplies a second bias voltage Vb4 to the gate of the buffer transistor T8. The second bias voltage supplying circuit 211 includes a sixth switch SW6. The sixth switch SW6 adjusts a timing to supply the second bias voltage Vb4 to the gate of the buffer transistor T8.

Figure 4:
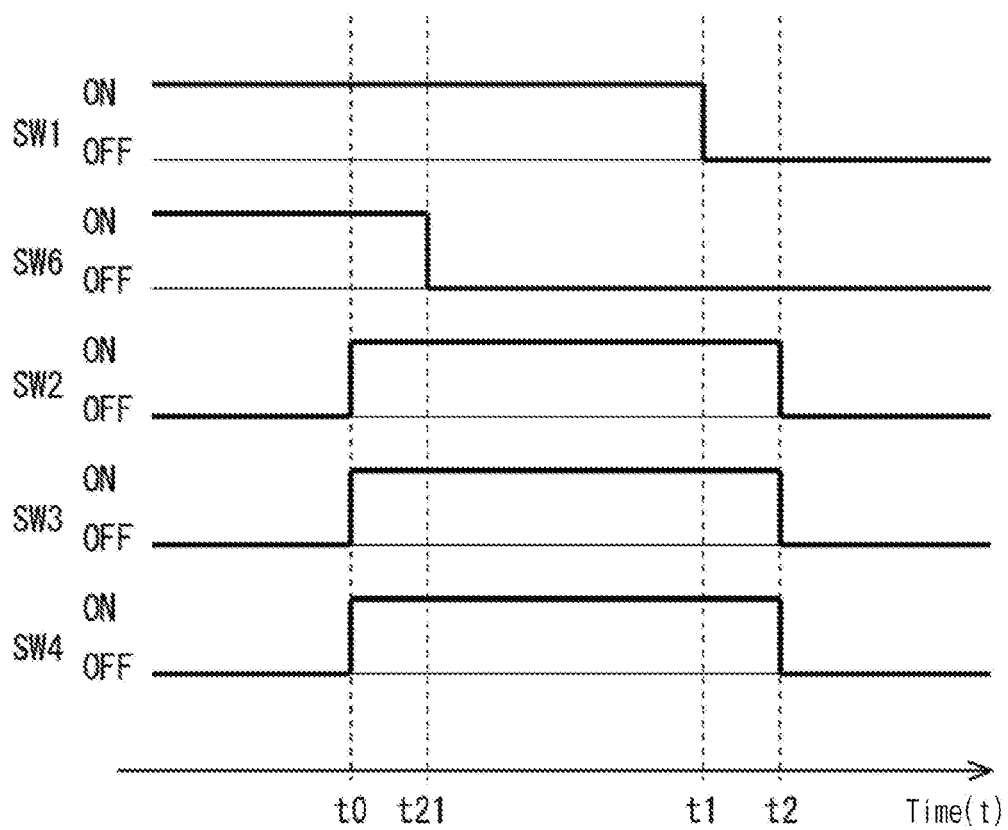
FIG. 4 is a timing diagram of switches in the comparator circuit of FIG. 3 according to an exemplary embodiment of the inventive concept.

Below, an operating timing of switches of the comparator circuit 20 according to the an exemplary embodiment of the inventive concept will be described with reference to FIG. 4. FIG. 4 is a timing diagram of the switches in the comparator circuit 20 of FIG. 3 according to an exemplary embodiment of the inventive concept.

The comparator circuit 20 according to an exemplary embodiment is different from the comparator circuit 10 of FIG. 1 in that the sixth switch SW6 is included. The sixth switch SW6 is turned on before the time t0 and changes from the on state to the off state at a time t21.

As illustrated in FIG. 4, the second switch SW2, the third switch SW3, and the fourth switch SW4 are turned on after the first switch SW1 and the sixth switch SW6 are turned on and are turned off after the first switch SW1 and the sixth switch SW6 are turned off. Also, the sixth switch SW6 is turned off before the first switch SW1 is turned off.

The comparator circuit 20 sets an operating point of each transistor by adjusting each switch depending on the above timing.

In the comparator circuit 20 according to an exemplary embodiment of the inventive concept, a signal may be supplied from the constant current supplying circuit A1 to the first connection circuit W1 through the above configuration. As such, the comparator circuit 20 may receive the second bias voltage Vb4 with a small impedance. The second bias voltage supplying circuit 211 may be configured to operate as a small load.

According to an exemplary embodiment of the inventive concept, the comparator circuit 20 is able to be driven with a low voltage. Also, the comparator circuit 20 according to an exemplary embodiment may decrease a load current associated with a bias voltage generating circuit in self-biasing. Accordingly, the comparator circuit 20 according to an exemplary embodiment may reduce power consumption of the bias voltage generating circuit. Accordingly, power consumption of an ADC circuit, a semiconductor device, or a mobile device that includes the comparator circuit 20 may be reduced.

Figure 5:
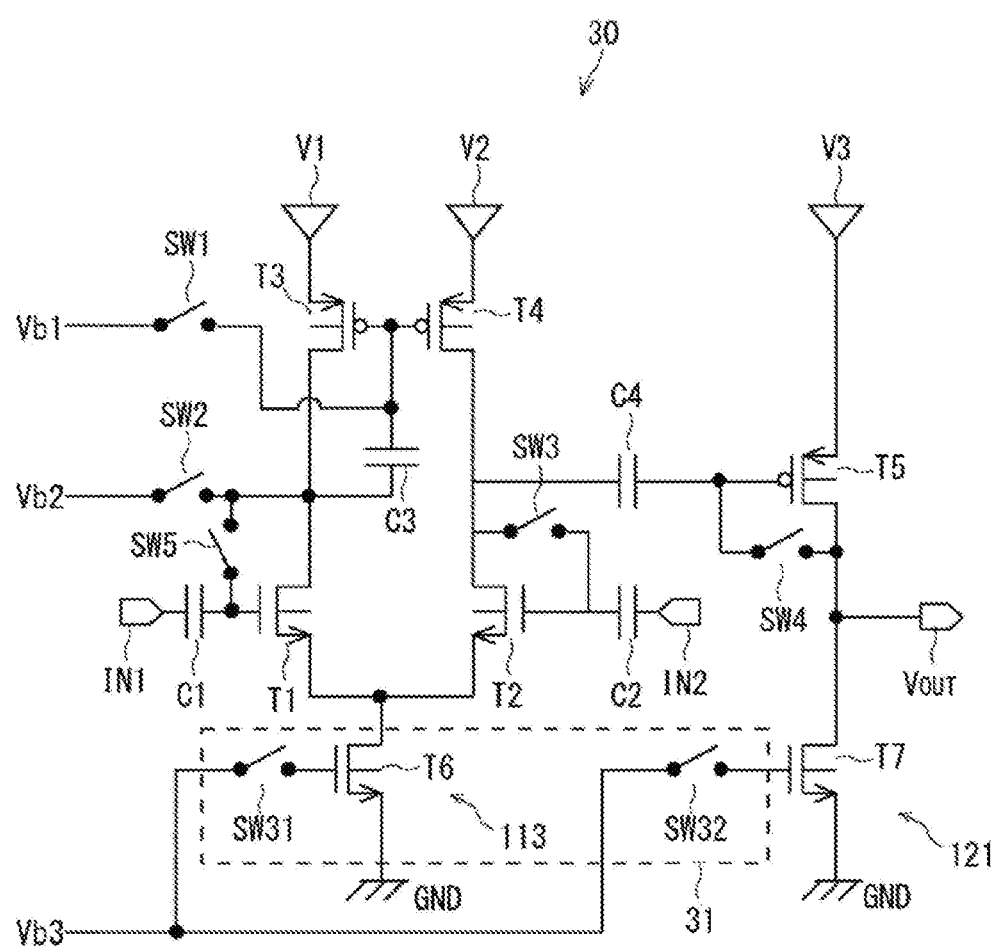
FIG. 5 is a circuit diagram of a comparator circuit according to an exemplary embodiment of the inventive concept.

Below, an exemplary embodiment of the inventive concept will be described with reference to FIG. 5. A configuration of FIG. 5 is different from the configuration of FIG. 1 in that the first current source 113 includes a first current source switch SW31 and the second current source 121 includes a second current source switch SW32. Below, a description will be focused on a difference between the configurations of FIG. 1 and FIG. 5.

In a comparator circuit 30 according to an exemplary embodiment of the inventive concept, the first current source 113 includes the sixth transistor T6, the second current source 121 includes the seventh transistor T7, and the third bias voltage Vb3 is applied to the gates of the sixth and seventh transistors T6 and T7. Also, the first current source 113 further includes the first current source switch SW31, and the second current source 121 further includes the second current source switch SW32.

The first current source switch SW31 is connected to the gate of the sixth transistor T6 and adjusts a timing to supply the third bias voltage Vb3 to the gate of the sixth transistor T6. The second current source switch SW32 is connected to the gate of the seventh transistor T7 and adjusts a timing to supply the third bias voltage Vb3 to the gate of the seventh transistor T7.

Figure 6:
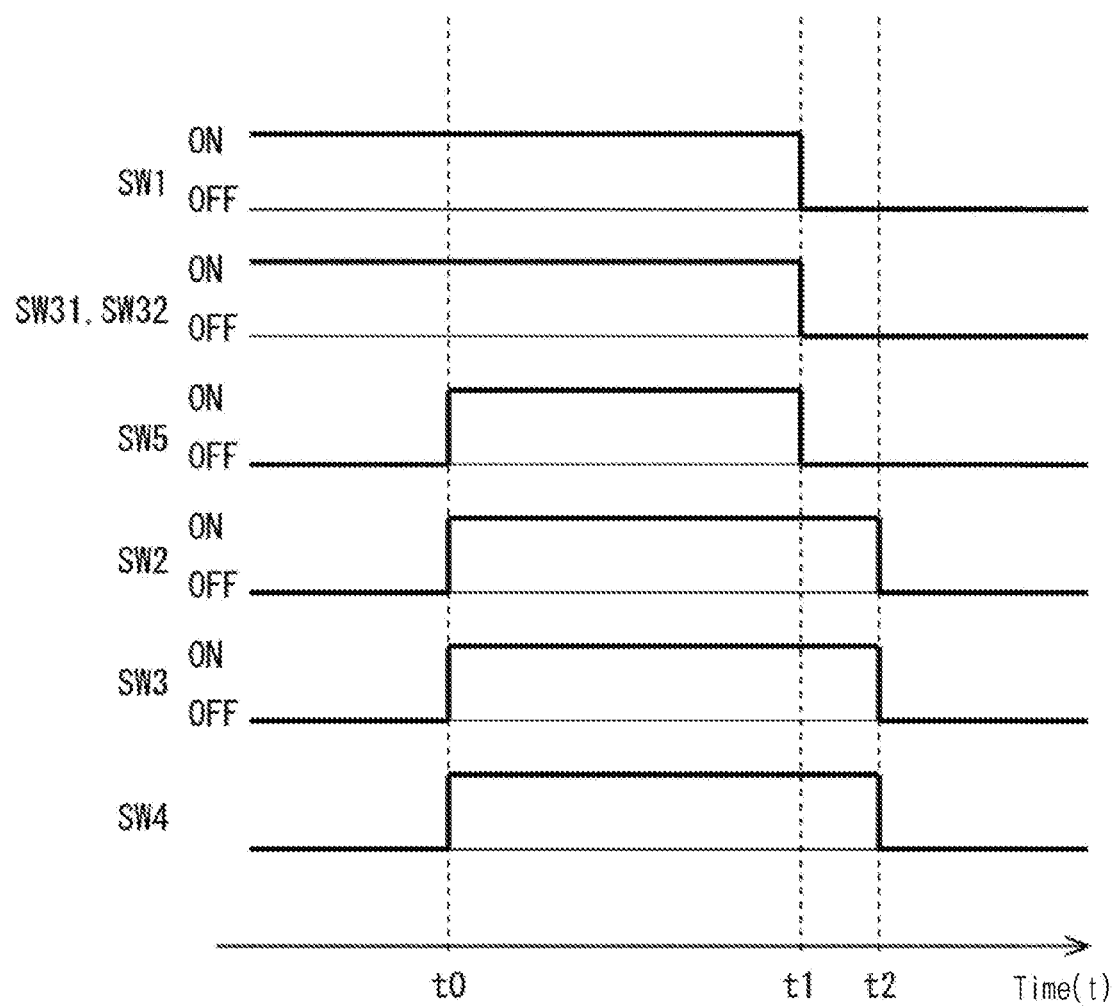
FIG. 6 is a timing diagram of switches in the comparator circuit of FIG. 5 according to an exemplary embodiment of the inventive concept.

Below, an operating timing of switches of the comparator circuit 30 according to an exemplary embodiment of the inventive concept will be described with reference to FIG. 6. FIG. 6 is a timing diagram of switches in the comparator circuit 30 according to an exemplary embodiment of the inventive concept.

The timing diagram illustrated in FIG. 6 is different from the timing diagram illustrated in FIG. 2 in that a timing associated with the current source switches SW31 and SW32 is added. The current source switches SW31 and SW32 are turned on before the time t0 and changes from the on state to the off state at the time t1. That is, the current source switches SW31 and SW32 are turned off at the same time when the first switch SW1 is turned off.

According to the above configuration, the comparator circuit 30 may reduce a mutual influence between the comparator circuit 30 and an adjacent circuit by turning off switches of current sources after a bias voltage is determined. The above configuration makes it difficult for the comparator circuit 30 including a plurality of switches to be influenced by noise due to a switching operation. Accordingly, abnormal operations due to noise may decrease in circuits that include the comparator circuit 30. Further, the comparator circuit 30 is able to be driven with a low voltage.

In an exemplary embodiment, a control circuit (not shown) is additionally present to provide control signals to one or more of the above-described switches (e.g., SW1-SW6, SW31-SW32, etc.) according to the timing depicted in FIG. 2, FIG. 4, or FIG. 6. In an exemplary embodiment, the control circuit is provided within a given one of the described comparators. When a given one of the comparators is present in an ADC circuit, the control circuit may be present in the ADC circuit.

According to exemplary embodiments of the inventive concept, one or more comparator circuits are provided that are able to be driven with a low voltage.

While the inventive concept has been described with reference to exemplary embodiments thereof, it will be apparent to those of ordinary skill in the art that various changes and modifications may be made thereto without departing from the spirit and scope of the inventive concept.

What is claimed is:

1. A comparator circuit comprising:
a differential amplifier configured to compare a first input signal and a second input signal to output a comparison result; and
an output amplifier configured to output an amplified signal based on the comparison result,
wherein the differential amplifier comprises:
a differential input circuit including a first transistor and a second transistor, the first input signal being applied to a gate of the first transistor through a first capacitor and the second input signal being supplied to a gate of the second transistor through a second capacitor;
a load circuit providing a load to the differential input circuit and including a third transistor connected to the first transistor with a first connection circuit interposed therebetween and a fourth transistor connected to the second transistor with a second connection circuit interposed therebetween, gates of the third transistor and the fourth transistor being connected to the first connection circuit through a third capacitor;
a first current source being a current source of the differential input circuit and connected to the first transistor and the second transistor;
a first bias voltage supplying circuit supplying a first bias signal different from the first and second input signals to the gates of the third transistor and the fourth transistor and the third capacitor, the first bias signal including a first bias voltage;
a second bias voltage supplying circuit supplying a second bias signal to the first connection circuit;
a third connection circuit connecting the gate of the first transistor and the first connection circuit;
a fourth connection circuit connecting the gate of the second transistor and the second connection circuit; and
a switch for adjusting a timing to supply the second bias voltage to the first connection circuit,
wherein the output amplifier comprises:
a fifth transistor comprising a gate supplied with a signal based on the comparison result through a fourth capacitor;
a second current source connected to the fifth transistor with a fifth connection circuit interposed therebetween;
a sixth connection circuit connecting a gate of the fifth transistor and the fifth connection circuit; and
an output part disposed in the fifth connection circuit and outputting the amplified signal.

2. The comparator circuit of claim 1, wherein the first bias voltage supplying circuit includes a first switch for adjusting a timing to supply the first bias voltage, wherein the third connection circuit includes a second switch for adjusting a timing to connect the gate of the first transistor and the first connection circuit, wherein the fourth connection circuit includes a third switch for adjusting a timing to connect the gate of the second transistor and the second connection circuit, and wherein the sixth connection circuit includes a fourth switch for adjusting a timing to connect the gate of the fifth transistor and the fifth connection circuit.

3. The comparator circuit of claim 2, wherein the first switch is turned on before the second switch, the third switch, the fourth switch, and the fifth switch are turned on, wherein the fifth switch, the second switch, the third switch, and the fourth switch are turned on at a same time, and wherein the second switch, the third switch, and the fourth switch are turned off after the first switch and the fifth switch are turned off.

4. The comparator circuit of claim 2, wherein the differential amplifier further comprises:
  a buffer circuit connected between the first capacitor and the gate of the first transistor,
  wherein the buffer circuit comprises:
  a constant current supplying circuit supplying a given current;
  a buffer transistor having a source, a drain, and a gate, one of the source and the drain is connected to the constant current supplying circuit, the other thereof is connected to a ground, and the first input signal and a second bias voltage are supplied to the gate; a second bias voltage supplying circuit supplying the second bias voltage; and
  a sixth switch for adjusting a timing to supply the second bias voltage to the gate of the buffer transistor.

5. The comparator circuit of claim 4, wherein the second switch, the third switch, and the fourth switch are turned on after the first switch and the sixth switch are turned on and are turned off after the first switch and the sixth switch are turned off.

6. The comparator circuit of claim 2, wherein each of the first current source and the second current source includes a current source transistor, a gate of the current source transistor is supplied with a third bias voltage.

7. The comparator circuit of claim 6, wherein each of the first current source and the second current source further comprises a current source switch for adjusting a timing to supply the third bias voltage.

8. The comparator circuit of claim 7, wherein the current source switch is turned off when the first switch is being turned off.

9. A mobile device comprising an analog-to-digital converter (ADC) circuit comprising a plurality of the comparator circuit, wherein each of the plurality of the comparator circuit comprises:
  a differential amplifier configured to compare a first input signal and a second input signal to output a comparison result; and
  an output amplifier configured to output an amplified signal based on the comparison result,
  wherein the differential amplifier comprises:
  a differential input circuit including a first transistor and a second transistor, the first input signal being applied to a gate of the first transistor through a first capacitor and the second input signal being supplied to a gate of the second transistor through a second capacitor;
  a load circuit providing a load to the differential input circuit and including a third transistor connected to the first transistor with a first connection circuit interposed therebetween and a fourth transistor connected to the second transistor with a second connection circuit interposed therebetween, gates of the third transistor and the fourth transistor being connected to the first connection circuit through a third capacitor;
  a first current source being a current source of the differential input circuit and connected to the first transistor and the second transistor;
  a first bias voltage supplying circuit supplying a first bias voltage to the gates of the third transistor and the fourth transistor and the third capacitor;
  a fourth capacitor connected to the second connection circuit and configured to output the comparison result;
  a third connection circuit connecting the gate of the first transistor and the first connection circuit; and
  a fourth connection circuit connecting the gate of the second transistor and the second connection circuit,
  wherein the output amplifier comprises:
  a fifth transistor comprising a gate connected to a terminal of the fourth capacitor;
  a second current source connected to the fifth transistor with a fifth connection circuit interposed therebetween;
  a sixth connection circuit connecting a gate of the fifth transistor and the fifth connection circuit; and
  an output part disposed in the fifth connection circuit and outputting the amplified signal.

10. The mobile device of claim 9, comprises a semiconductor device, wherein the semiconductor device comprises:
  the ADC circuit; and
  a plurality of photoelectric conversion elements arranged in a matrix shape, wherein the ADC circuit performs discrete processing on an analog signal generated by the photoelectric conversion elements.

11. The mobile device of claim 9, further comprises a lens for imaging a picture of a subject, wherein the semiconductor device generates and processes picture data imaged through the lens.

12. A comparator circuit comprising:
  a differential amplifier configured to compare a first input signal and a second input signal to output a comparison result; and
  an output amplifier configured to output an amplified signal based on the comparison result,
  wherein the differential amplifier comprises:
  a differential input circuit including a first transistor and a second transistor, the first input signal being applied to a gate of the first transistor through a first capacitor and the second input signal being supplied to a gate of the second transistor through a second capacitor;
  a load circuit providing a load to the differential input circuit and including a third transistor connected to the first transistor with a first connection circuit interposed therebetween and a fourth transistor connected to the second transistor with a second connection circuit interposed therebetween, gates of the third transistor and the fourth transistor being connected to the first connection circuit through a third capacitor; a first current source being a current source of the differential input circuit and connected to the first transistor and the second transistor;
  a first bias voltage supplying circuit supplying a first bias voltage to the gates of the third transistor and the fourth transistor and the third capacitor;
  a third connection circuit connecting the gate of the first transistor and the first connection circuit;
  a fourth connection circuit connecting the gate of the second transistor and the second connection circuit; and a buffer circuit connected between the first capacitor and the gate of the first transistor.

13. The comparator circuit of claim 12, wherein the buffer circuit comprises:
   a constant current supplying circuit supplying a given current;
   a buffer transistor having a source, a drain, and a gate, one of the source and the drain is connected to the constant current supplying circuit, the other thereof is connected to a ground, and the first input signal and a second bias voltage are supplied to the gate; and
   a second bias voltage supplying circuit supplying the second bias voltage.

14. The comparator circuit of claim 13, wherein the output amplifier comprises:
   a fifth transistor comprising a gate supplied with a signal based on the comparison result through a fourth capacitor;
   a second current source connected to the fifth transistor with a fifth connection circuit interposed therebetween;
   a sixth connection circuit connecting a gate of the fifth transistor and the fifth connection circuit; and,
   an output part disposed in the fifth connection circuit and outputting the amplified signal.

15. The comparator circuit of claim 14, wherein the first bias voltage supplying circuit includes a first switch for adjusting a timing to supply the first bias voltage, wherein the third connection circuit includes a second switch for adjusting a timing to connect the gate of the first transistor and the first connection circuit, wherein the fourth connection circuit includes a third switch for adjusting a timing to connect the gate of the second transistor and the second connection circuit, and wherein the sixth connection circuit includes a fourth switch for adjusting a timing to connect the gate of the fifth transistor and the fifth connection circuit.

16. The comparator circuit of claim 15, wherein the differential amplifier further comprises:
   a second bias voltage supplying circuit supplying a second bias voltage to the first connection circuit; and
   a fifth switch for adjusting a timing to supply the second bias voltage to the first connection circuit.

17. The comparator circuit of claim 16, wherein the second bias voltage supplying circuit further comprises a sixth switch for adjusting a timing to supply the second bias voltage to the gate of the buffer transistor.

18. The comparator circuit of claim 17, wherein the second switch, the third switch, and the fourth switch are turned on after the first switch and the sixth switch are turned on and are turned off after the first switch and the sixth switch are turned off.

19. The comparator circuit of claim 14, wherein each of the first current source and the second current source includes a current source transistor, a gate of the current source transistor is supplied with a third bias voltage.

* * * * *